(12) United States Patent
Liao et al.

(10) Patent No.: US 6,446,252 B1
(45) Date of Patent: Sep. 3, 2002

(54) PHOTOMASK METHOD FOR MAKING THE SAME CAPACITOR CELL AREA NEAR OUTMOST CELL ARRAYS

(75) Inventors: Wen-shiang Liao, Miao-Li; Ching-Ying Lee, Hsinchu; Chun-Ju Huang, Hsinchu; Chao-Ming Koh, Hsinchu, all of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 139 days.

(21) Appl. No.: 09/635,649

(22) Filed: Aug. 10, 2000

(51) Int. Cl.⁷ .............................................. G06F 17/50
(52) U.S. Cl. ................................... 716/19; 716/21
(58) Field of Search ........................ 716/19–21; 430/5

(56) References Cited

U.S. PATENT DOCUMENTS 5,847,421 A * 12/1998 Yamaguchi ................. 257/207
5,994,009 A * 11/1999 Tzu et al. ..................... 430/30
6,077,310 A * 6/2000 Yamamoto et al. ........... 716/19
6,081,658 A * 6/2000 Rieger et al. ................. 716/19
6,143,596 A * 11/2000 Wang .......................... 438/238

* cited by examiner

*Primary Examiner*—Vuthe Siek
*Assistant Examiner*—Sun James Lin
(74) *Attorney, Agent, or Firm*—Bacon & Thomas

(57) ABSTRACT

A method for manufacturing a photomask of cylindrical capacitor arrays surrounded by a corrugated protection trench is provided. First, a capacitor array layout is generated, next, the capacitor array patterns are copied to protection trench area with exact the same shape and pitch, finally, the protection trench is finished by filling connecting patterns between gaps of the capacitor arrays. A corrugated close loop protection trench pattern can hence be developed upon photoresist through the exposing and is developing of a photo stepper.

9 Claims, 7 Drawing Sheets

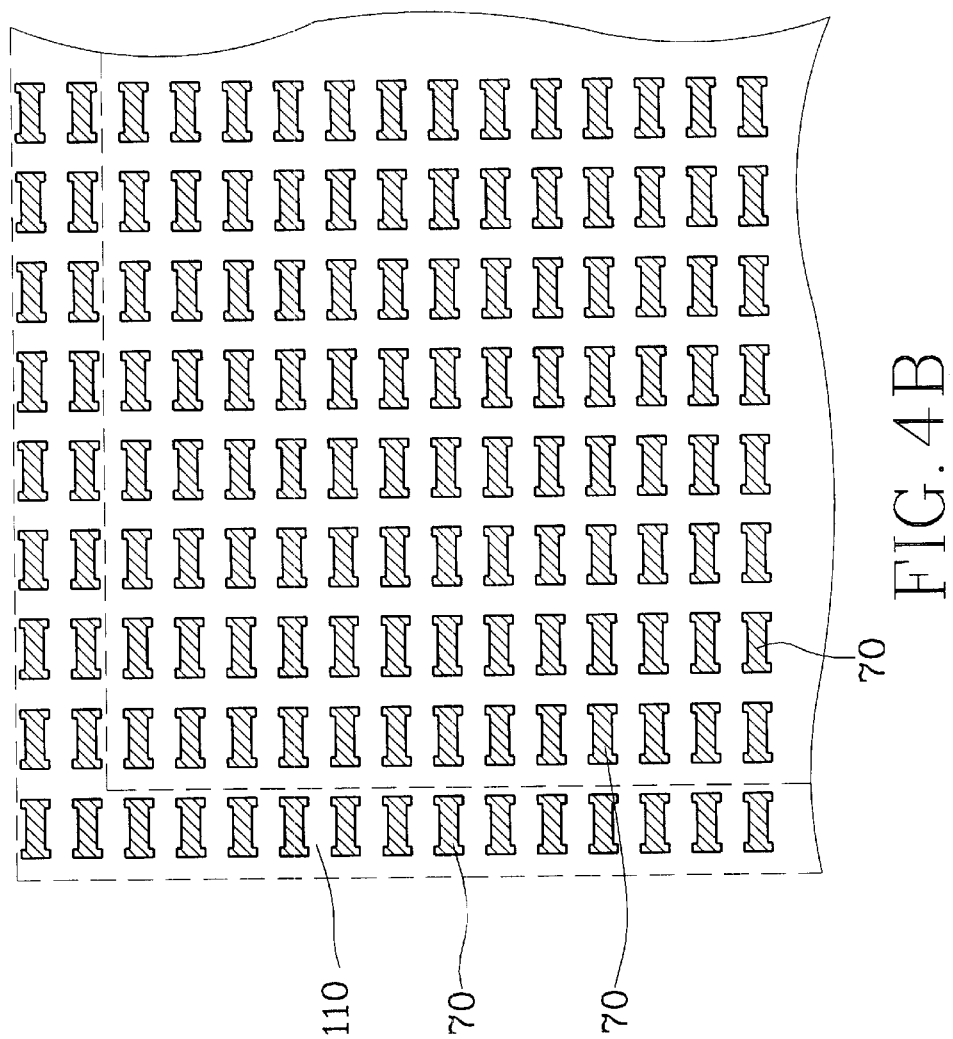

PHOTOMASK METHOD FOR MAKING THE SAME CAPACITOR CELL AREA NEAR OUTMOST CELL ARRAYS

BACKGROUND OF THE INVENTION

1. Field of the Invention

The present invention relates to a method for manufacturing a dynamic random access memory (DRAM) array, and more particularly to a method of generating a photomask layout for DRAM devices with cylindrical capacitor arrays.

2. Description of the Prior Art

A DRAM cell comprises metal-oxide-semiconductor field effect transistors (MOSFETs) and capacitors that are built in a semiconductor silicon substrate. There is an electrical contact between the source of a MOSFET and the storage node of the adjacent capacitor, forming a memory cell of DRAM. A large number of memory cells make up the cell arrays which combine with the peripheral circuit to produce DRAMs.

In recent years, the sizes of the MOSFETs and capacitors have become continuously decreasing so that the packing densities of these DRAM devices have increased considerably. These high density DRAMs offer the advantages of longer refresh time as well as less power consumption. However, as the sizes of the capacitors become smaller, so as the capacitance of the capacitors are decreasing, that reduces the signal to noise ratio of the DRAM circuits, causing the performance problem. The issue of maintaining or even increasing the surface area of the storage nodes or reducing the thickness of the dielectric layer is particularly important as the density of the DRAM arrays continues to increase for future generations of memory devices.

There are two ways to deal with this problem: decreasing the thickness of the capacitor dielectric layer (ONO) or increasing the surface area of the capacitors. Since decreasing the thickness of the capacitor dielectric layer (ONO) almost reaches its physical limitation already, increasing the capacitor surface area becomes an easier approach when the capacitor is used to fabricate 64 Mbit DRAMs and beyond. Various shapes of capacitor structures have been used to address this issue. U.S. Pat. No. 5,185,282 to Lee et al. of Hyundai Electronics (the entire disclosure of which is herein incorporated by reference) provides a method of fabricating cup-shaped capacitor storage node. Another U.S. Pat. No. 5,021,357 to Taguchi et al. of Fujisu (the entire disclosure of which is herein incorporated by reference) discloses a method of fabricating fin structure capacitor electrode. U.S. Pat. No. 5,021,357 to Choi et al. of Samsung (the entire disclosure of which is herein incorporated by reference) provides a method of fabricating cylinder-shaped capacitor structure.

Referring now more particularly to FIG. 1, there is shown a typical cross-sectional view of a DRAM cell comprising of the cylindrical capacitor array. First, a P-well and an N-well (not shown in the Figure) are formed in a silicon substrate 100. Next, shallow trench isolation (STI) (not shown in the Figure) is sequentially formed by the techniques well known in the art. Wordlines 20 including gate dielectric 21, polysilicon gate electrode 22, lightly doped drains (LDDs) (not shown in the Figure), source/drain (S/D) regions 23 and sidewall spacers 24 are then formed upon the semiconductor silicon substrate. Next, an inter-polysilicon oxide (IPO) layer 30 is deposited and planarized by chemical mechanical polishing (CMP). Thereafter, first polysilicon plugs 40 are formed followed by sequentially depositing an etch stop layer 50 and an oxide layer 60 over the IPO layer 30. The etch stop layer 50 is typically composed of silicon nitride or oxynitride.

Next, storage nodes 80 together with the protection trenches are formed by the conventional photolithography and anisotropic etching techniques. The storage nodes are typically made of hemispherical grained silicon (HSG-Si) which is grown on the surface of a thin polysilicon base layer over the oxide layer 60. Thereafter, excess HSG-Si 80 and polysilicon seed layer are removed by CMP to obtain electrically isolated crown capacitors. Finally, capacitor dielectric layer (not shown in the Figure for simplicity reason) and top plate 90 of the capacitors are sequentially deposited upon the cylindrical capacitors. The capacitor dielectric layer is typically using high dielectric constant composite oxide/nitride layers such as ONO or NO to obtain enough capacitance pre unit cell for high density DRAM applications.

Referring now to FIG. 2, there is shown a conventional photomask layout used for defining cylindrical capacitors 70. There is a protection trench 100 around capacitor arrays that can protect capacitor arrays from being damaged by solvent or acids in the subsequent violent processes. The typical shape of the protection trench is a scribed line like rectangular strips.

However, the sizes of both the DRAM cell and the capacitors are continuously decreasing when entering sub-micron or even deep sub-micron technology era. The process window becomes smaller that requires high precision process control. Referring now to FIG. 3, the capacitors in the periphery tends to distort due to the optical proximity effect during the photolithography procedure. As a result, the capacitance become smaller than the original design and the capacitance variation causes negative impacts on yield and performance of the DRAMs. In addition, those misshaped capacitors can further induce capacitance variation that causes reliability issue.

Analysis of the outmost mishaped capacitor problem reveals that it is a result of optical proximity effect during lithography process. In any photoresist exposing situation the local reaction speed up on the periphery area because the photoresist received more UV radiation. Because a level of uniform capacitance within the capacitor array must be met, this figure cannot be tolerated. In order to obtain uniform capacitor arrays, there is a need to provide a new set of layout criteria that pertains to capacitor array and their optimization within DRAM cells.

SUMMARY OF THE INVENTION

Accordingly, it is a primary object of the present invention to provide a method of designing a photomask for DRAM with the same area size of cylindrical capacitor arrays.

It is another object of the present invention to provide a method of forming a protection trench to protect cylindrical capacitor array during processing.

It is a further object of the present invention to provide a novel photomask layout to fabricate cylindrical capacitor arrays with uniform apacitance value.

These objects are accomplished by the method described below.

First, the capacitor array layout is automatically generated by an Electronic Design Automation (EDA) software. Next, the capacitor array patterns are copied to protection trench area with exact the same shape and pitch by using the EDA tool. Finally, the protection trench is finished by filling connecting patterns between gaps of the capacitor arrays, thus, forming a corrugated close loop protection trench after photoresist exposing and developing. This step is the key feature of the present invention. The key point of the present invention is that the shape of the protection trench is modified from rectangular strips to a mesh-like pattern that can effectively relieve the optical proximity effect of the prior art. Therefore, a level of uniform capacitance of the array can be met according to the embodiment of the present invention. A uniform area size of capacitor array can be accomplished according to the present invention.

In summary, with the present invention, a novel photomask layout to generate cylindrical capacitor arrays is provided for fabricating integrated circuit devices on the surface of a semiconductor substrate. In such a way, the mesh-like protection trench around capacitor arrays can also effectively protect the capacitor arrays from being damaged by solvent or acids during subsequent violent processes. Since the mesh-like trench makes the outmost capacitor arrays no longer stand in the periphery of the cell array, optical proximity effect can be avoided. Therefore, uniform capacitance can be obtained within the DRAM cell array, which eliminates the yield, performance, and reliability issues.

BRIEF DESCRIPTION OF THE DRAWINGS

The accompanying drawings form a material part of this description, in which:

FIG. 4B shows the partial completed photomask layout of the protection trench which is formed by directly duplicating the capacitor array pattern according to the present invention.

DETAILED DESCRIPTION OF THE INVENTION

Figure 1:
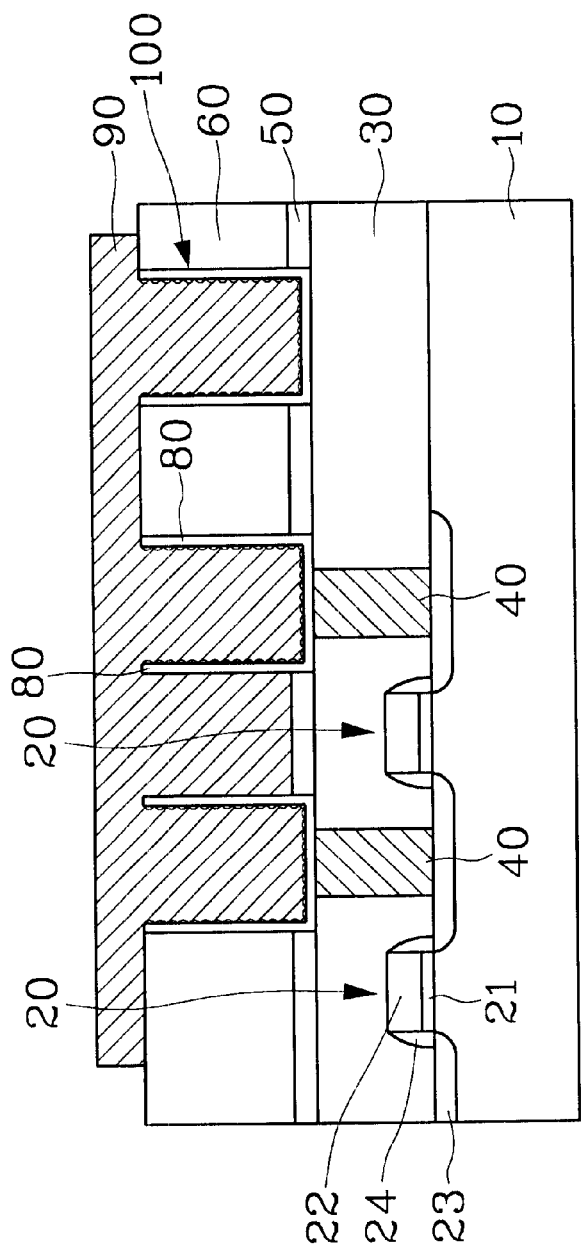
FIG. 1 shows a cross sectional view of a conventional DRAM cell with cylindrical capacitor array.
Figure 2:
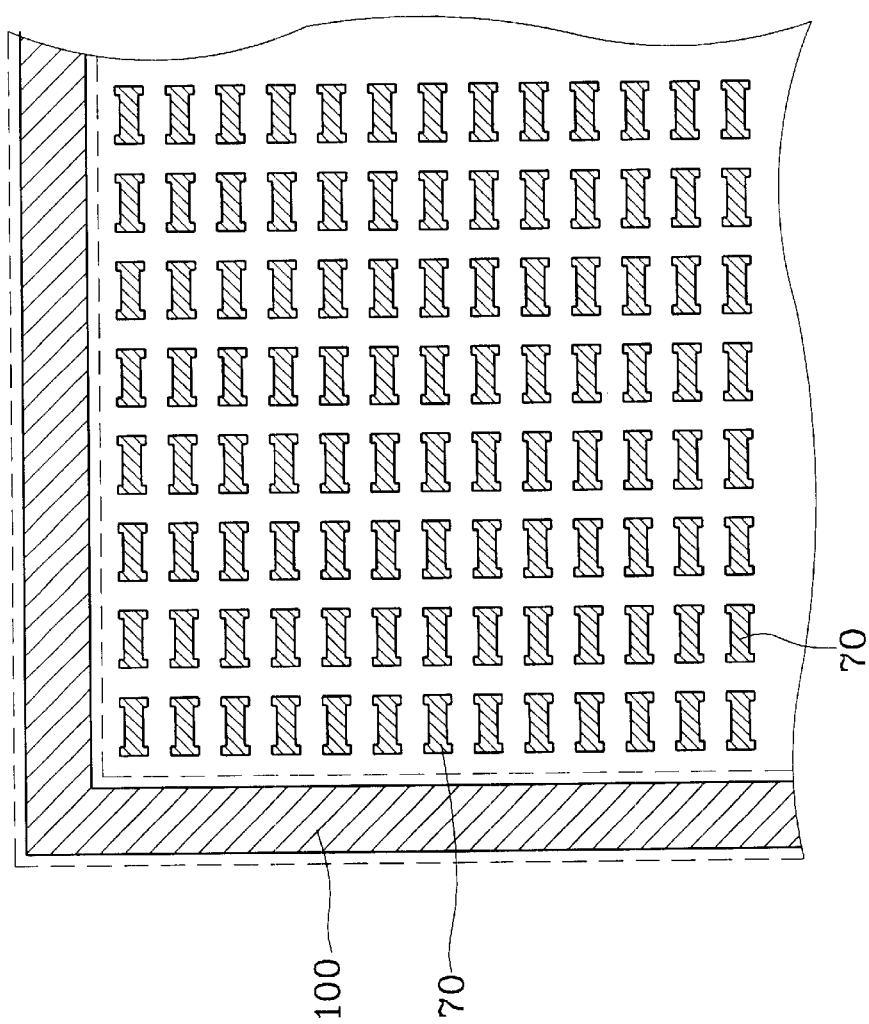
FIG. 2 shows a conventional photomask layout of the DRAM cell with cylindrical capacitor array which is isolated by a protection trench
Figure 3:
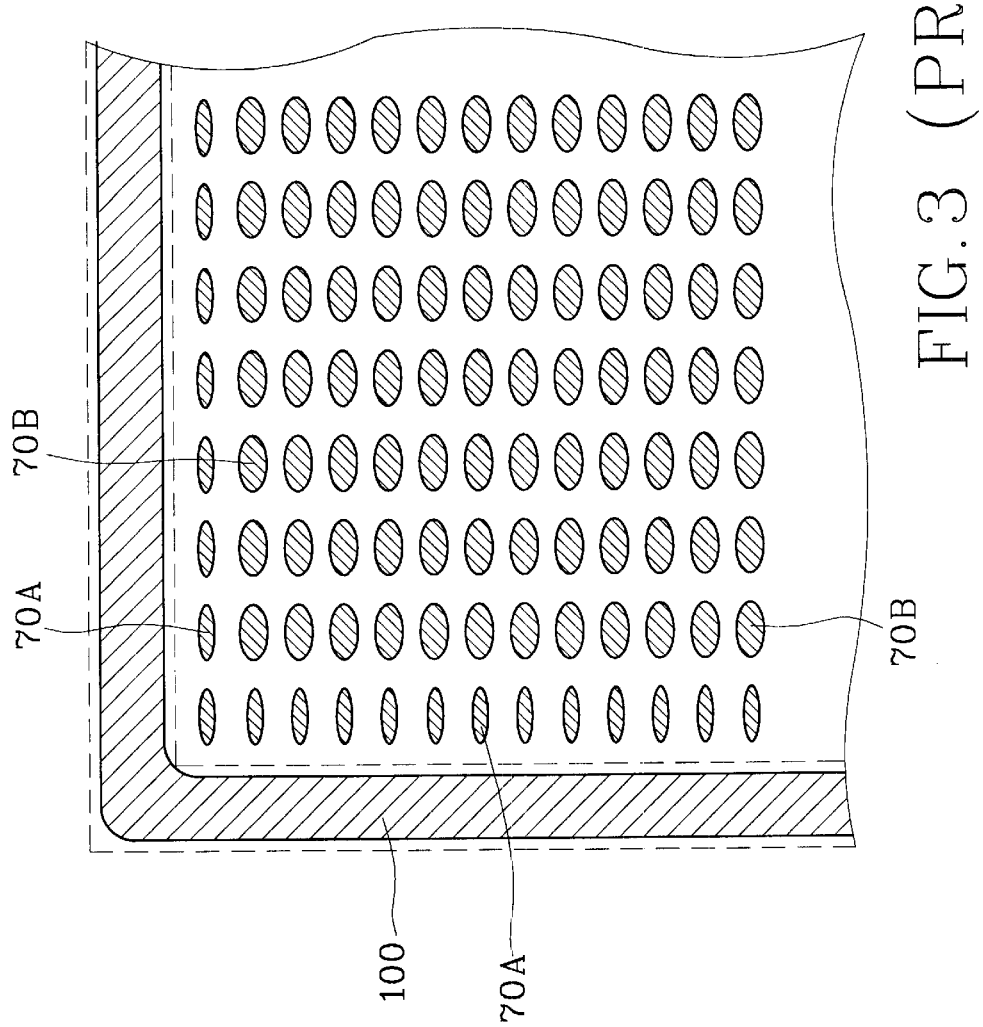
FIG. 3 shows the top view of the cylindrical capacitor array photoresist pattern after the photoresist is developed according to the prior art

The invention disclosed herein is directed to a novel photomask layout to fabricate cylindrical capacitor arrays with uniform capacitance. The drawing figures are illustrated a partially completed integrated circuit device. In the following description, details are set forth in order to provide a thorough understanding of the present invention. It will be appreciated by one skilled in the art that variations of these specific details are possible while still achieving the results of the present invention. In other instance, well-known processing steps are not described in detail in order not unnecessarily to obscure the present invention.

The key point of the present invention is that the shape of the protection trench is modified from rectangular strips to a mesh-like pattern that can effectively relieve the optical proximity effect of the prior art. Therefore, a level of uniform capacitance value of the array can be met according to the embodiment of the present invention.

Figure 4A:
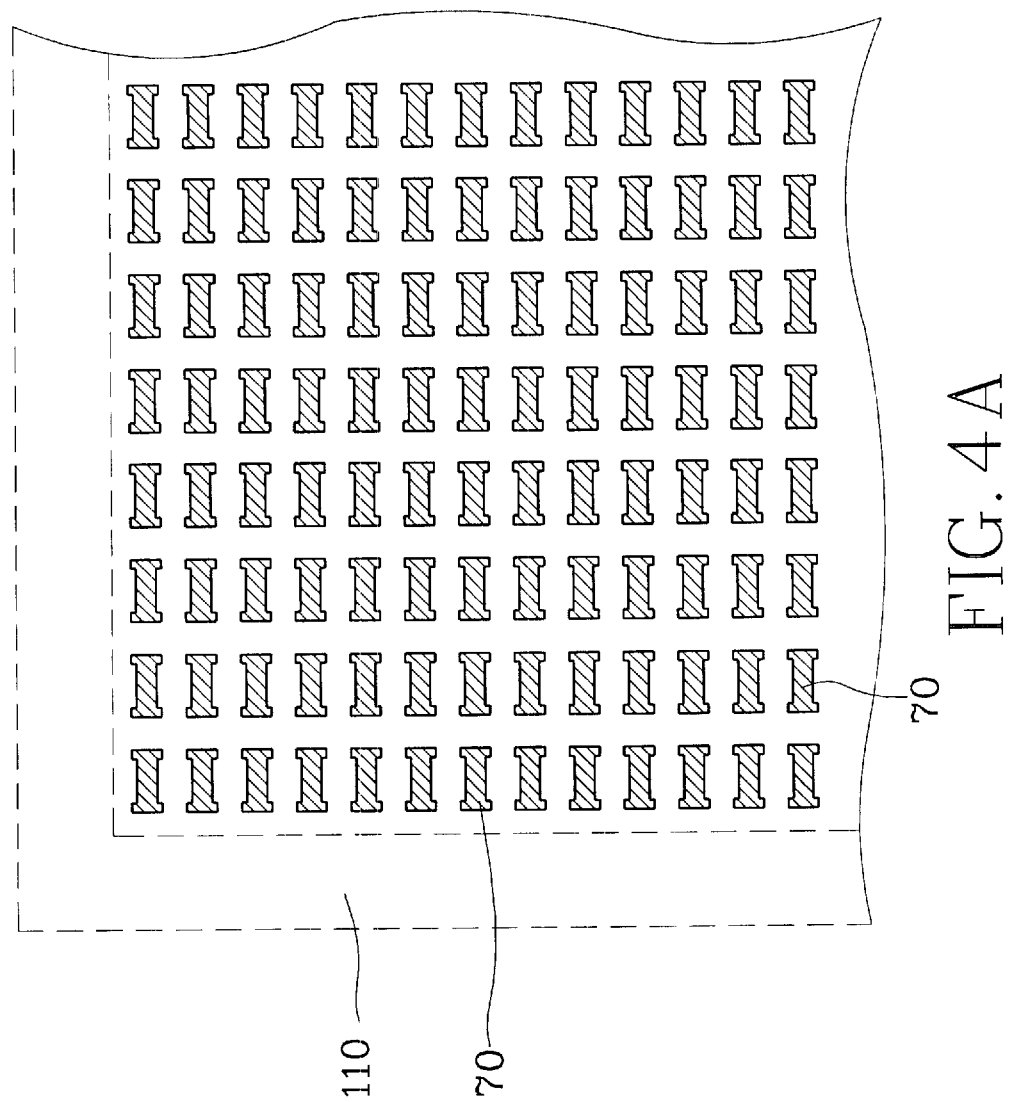
FIG. 4A shows the photomask layout of the cylindrical capacitor array according to the present invention.

Referring now more particularly to FIG. 4A, there is shown the first step to generate a photomask layout for defining cylindrical capacitor arrays 70 of the present invention. The mask includes a cylindrical capacitor array area 70 and a protection trench area 110 which is depicted in dashed lines.

Referring now to FIG. 4B, the partial completed photomask layout is used for defining protection trench 110. This step is one of the key features of the present invention. The capacitor array patterns are copied to protection trench area 110 with exact the same shape 70 and pitch by using the EDA tool as shown in FIG. 4B.

Figure 4C:
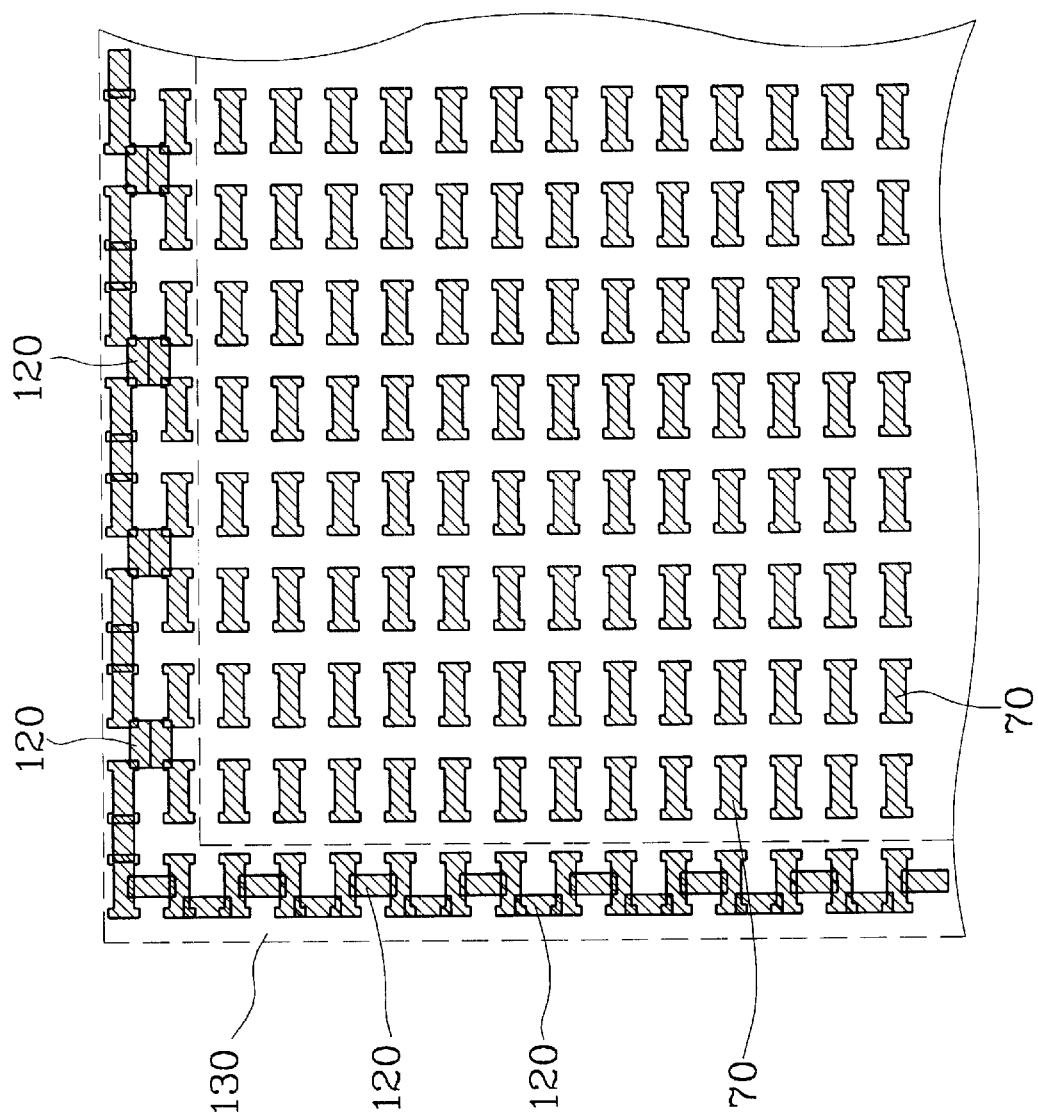
FIG. 4C shows the completed photomask layout of the isolated protection trench which is formed by connecting the discontinuous patterns according to the present invention.

Referring now to FIG. 4C, there is shown the completed photomask layout used for defining protection trench 110. This step is the key feature of the present invention. Finally, the corrugated close loop protection trench 130 is formed by filling connecting patterns 120 between gaps of the capacitor arrays by using the EDA software again as shown in FIG. 4C. The connecting patterns 120 can be shapes of rectangular and square. Since the feature size in the protection trench is now in the same order of the capacitor arrays, optical proximity effect in the outmost cell arrays can be minimized. A precision capacitor array in the inner cell array can be accomplished according to the embodiment of the present invention.

Figure 5:
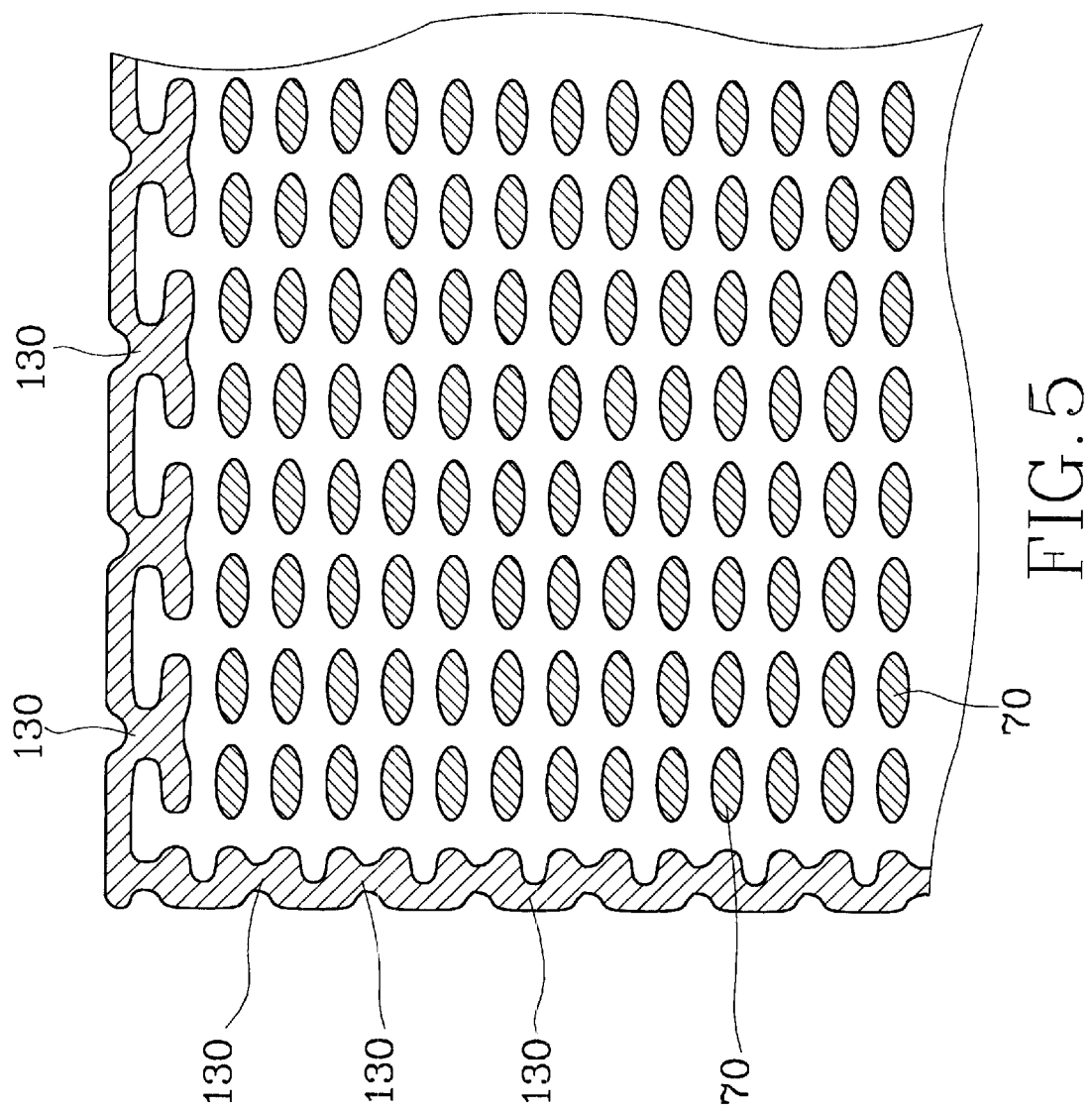
FIG. 5 shows the top view of the stacked cylindrical capacitor array photoresist pattern after the photoresist is developed according to the present invention.

In summary, with the present invention a novel photomask layout to generate cylindrical capacitor arrays is provided for fabricating DRAM on the surface of a semiconductor substrate. Finally, FIG. 5 shows a top view of the cylindrical capacitor array photoresist pattern after the photoresist is developed./in such a way, the mesh-like protection trench 130 around capacitor arrays can effectively protect capacitor arrays from being damaged by solvent or acids in the subsequent processes. Uniform capacitance can be obtained within the DRAM cell array, thus, no yield, performance, or reliability issues need to be concerned.

While the invention has been particularly shown and described with reference to a preferred embodiment, it will be understood by those who skilled in the art that various changes in form and detail may be made therein without departing from the spirit and scope of the present invention.

What is claimed is:

1. A method of manufacturing a photomask of capacitor arrays surrounding with a protection trench, comprising the steps of:
   a. generating a capacitor array pattern;
   b. generating a protection trench pattern, wherein said protection trench comprising the same pattern as said capacitor array with exactly the same shape and pitch and connecting figures between gaps of said pattern of the protection trench; and
   c. transferring said capacitor array and protection trench patterns to said photomask.

2. The method of claim 1, wherein said connecting figure is rectangular.

3. The method of claim 1, wherein said connecting figure is square.

4. A method of manufacturing a photomask of cylindrical capacitor arrays surrounding with a protection trench, said photomask having a capacitor array area and a trench area, comprising the steps of:
   a. generating a cylindrical capacitor array pattern on said capacitor array area;

b. generating a protection trench pattern on said trench area, wherein said protection trench pattern is created by first copying the same pattern as said cylindrical capacitor array with exactly the same shape and pitch, and then filling connecting figures between gaps of said protection trench pattern; and c. transferring said cylindrical capacitor array and protection trench patterns to said photomask.

5. The method of claim 4, wherein said connecting figure is rectangular.

6. The method of claim 4, wherein said connecting figure is square.

7. A photomask of cylindrical capacitor arrays surrounding with a protection trench, said photomask having a capacitor array area and a trench area; wherein the improvement comprises that said protection trench comprises the same pattern as said cylindrical capacitor array with exactly the same shape and pitch which is further connected by figures between gaps of said protection trench pattern.

8. The photomask of claim 7, wherein said figure is rectangular.

9. The photomask of claim 7, wherein said figure is square.

* * * * *